United States Patent [19]
Ujiie et al.

[11] Patent Number: 6,137,170
[45] Date of Patent: *Oct. 24, 2000

[54] MOUNT FOR SEMICONDUCTOR DEVICE

[75] Inventors: Masato Ujiie; Yasuhiro Kurokawa, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/908,063

[22] Filed: Aug. 11, 1997

[30] Foreign Application Priority Data

Aug. 20, 1996 [JP] Japan .................................. 8-218220

[51] Int. Cl.⁷ ............................ H01L 23/12; H01L 23/48
[52] U.S. Cl. ......................... 257/711; 257/697; 257/731
[58] Field of Search ................................. 257/693, 697, 257/701, 711, 731–733

[56] References Cited

U.S. PATENT DOCUMENTS

| | | | |
|---|---|---|---|
| 5,315,155 | 5/1994 | O'Donnelly et al. | 257/711 |
| 5,629,566 | 5/1997 | Doi et al. | 257/789 |
| 5,650,662 | 7/1997 | Edwards et al. | 257/700 |

FOREIGN PATENT DOCUMENTS

| | | |
|---|---|---|
| 60-77434 | 5/1985 | Japan . |
| 60-136344 | 7/1985 | Japan . |
| 61-212043 | 9/1986 | Japan . |
| 1-239959 | 9/1989 | Japan . |
| 5-226501 | 9/1993 | Japan . |
| 6-350010 | 12/1994 | Japan . |
| 8-46086 | 2/1996 | Japan . |

*Primary Examiner*—David Hardy
*Assistant Examiner*—Allan R. Wilson

[57] ABSTRACT

A semiconductor device includes a semiconductor pellet (1), and a package having a pellet mount portion (21) on which a semiconductor pellet (1) is mounted. The semiconductor pellet (1) is mounted on the pellet mount portion (21) of the package through a joint material (6). The area of the surface of the pellet mount portion (21) on which the semiconductor pellet (1) is mounted is set to be smaller than the area of the surface of the semiconductor pellet (1) which is mounted on the pellet mount portion (21), thereby preventing the climb-up of the joint material (6) along the side surface of the semiconductor pellet (1).

17 Claims, 2 Drawing Sheets

MOUNT FOR SEMICONDUCTOR DEVICE

BACKGROUND OF THE INVENTION

1. Field of the Invention

The present invention relates to a semiconductor device, and particularly to a semiconductor device having a semiconductor mount board on which a semiconductor pellet is mounted and to a semiconductor device having a package in which a semiconductor pellet is accommodated.

2. Description of the Related Art

In these types of semiconductor device, a semiconductor pellet is accommodated in a package or mounted on a semiconductor mount board to protect the semiconductor pellet from an impact from the external and facilitate the electrical connection between the semiconductor pellet and the external.

Further, a ceramic package has been known as being suitable as a package in which an LSI chip or large-size chip to which high reliability is required. The ceramic package is also used for an LSI chip having high power consumption because it is more excellent in heat radiation characteristic as compared with a plastic package. When a semiconductor pellet is accommodated in the ceramic package, a joint material or an adhesive material is coated on a pellet mount portion in a cavity which is formed in the package, and the semiconductor pellet is mounted on the pellet mount portion via the joint material. At this time, the peripheral portion of the semiconductor pellet is held by an instrument which is called as "collet", and scrubbed, whereby the semiconductor pellet is joined to the pellet mount portion.

In the semiconductor device as described above, as indicated in Japanese Patent Application Laid-open No. Sho-61-212043 (hereinafter referred to as "prior art", the joint material climbs up on the inner lateral wall of the mount board in a joint process, and a gap occurs between the semiconductor pellet and the pellet mount portion in a pellet mount process, resulting in occurrence of voids in the joint material or cracks in the semiconductor pellet.

In order to solve the above problem, a groove to flatten the level of the joint material is formed on the mount board around the pellet mount portion in the prior art. ceramic package as described above. That is, the joint material is poured into the groove to flatten the level of the joint material.

However, such a prior art ceramic package has a problem as shown in FIG. 1. That is, if the coating amount of the joint material 6 is large or the frequency of the scrubbing with the collet is high, the joint material 6 would climb up along the side surface of the semiconductor pellet 1 toward the upper at portion of the semiconductor pellet 1 (toward a surface of the semiconductor pellet 1 which is located at the opposite side to the other surface of the semiconductor pellet 1 which is brought into contact with the pellet mount portion 34, that is, in the upward direction of FIG. 4) even when the groove is provided on the periphery of the pellet mount portion 34.

Further, if the joint material which climbs up as described above is attached to the tip of the collet for grasping the semiconductor pellet, the bonding pad of the semiconductor pellet and the bonding pad of the package side in the scrubbing process, a problem is caused that the joint material adheres to the peripheral portions of the other semiconductor pellet and the wire bonding cannot be performed. When the joint material has electrical conductivity, wires or bonding pads are connected to one another by the joint material climbed up to induce short-circuit failure.

Still further, in order to avoid the above problem, a ceramic package having the joint material climbed up is regarded as a defective package by a visual check in the process of mounting the semiconductor pellet on the ceramic package, so that high yield cannot be obtained.

SUMMARY OF THE INVENTION

In order to solve the above problem, an object of the present invention is to provide a semiconductor device having a semiconductor pellet accommodated in a package or mounted on a semiconductor mount board, which can prevent joint material from climbing up.

Another object of the present invention is to provide a semiconductor device having a semiconductor pellet mounted in a package or on a semiconductor mount board, which can achieve the above object without increasing the length of a bonding wire.

The inventors of this application have found that the climb of the joint material in the conventional ceramic package is caused by the design of the conventional ceramic package in which the area of the surface of the pellet mount portion on which the semiconductor pellet is mounted is set to be equal to or larger than the area of the surface of the semiconductor pellet which is mounted on the pellet mount portion, and provides the following means in order to prevent the climb of the joint material.

That is, according to a package of the present invention, the area of the surface of the pellet mount portion on which the semiconductor pellet is mounted (hereinafter referred to as "pellet mount surface of the pellet mount portion") is set to be smaller by a predetermined area than the area of the surface of the semiconductor pellet which is mounted on the pellet mount portion (hereinafter referred to as "joint surface of the semiconductor pellet").

Here, when the semiconductor pellet is designed in a substantially rectangular parallelepiped shape and the pellet mount surface of the pellet mount portion is designed in a substantially rectangular shape, the predetermined area is preferably determined so that the length-of each side of the pellet mount surface of the pellet mount portion is shorter than the length of the corresponding side of the joint surface of the semiconductor pellet within a range from 0.1 mm to 4 mm.

With the above design, even when the coating amount of the joint material or the adhesive material is large or the scrubbing is performed with the collet at high frequency, the joint material climbs down along the side surface of the pellet mount portion in the opposite direction to the semiconductor pellet, and thus the joint material is prevented from climbing up along the side surface of the semiconductor pellet.

DETAILED DESCRIPTION OF THE PREFERRED EMBODIMENTS

Figure 1:
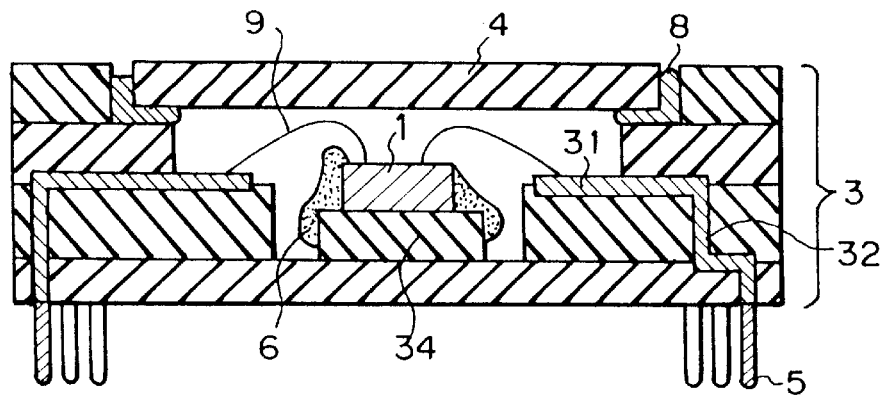
FIG. 1 is a schematic cross-sectional view showing a prior art.

Preferred embodiments according to the present invention will be described with reference to the accompanying drawings.

(First Embodiment)

In a ceramic package according to a first embodiment of the present invention, a pellet mount portion 21 is formed as a part of a metal plate 2 to enhance the heat radiation characteristic of a semiconductor pellet 1. Further, the ceramic package of this embodiment is a so-called ceramic pin grid array package having a cavity-down structure (hereinafter referred to as "ceramic PGA package") in which the semiconductor pellet 1 and the pellet mount portion 21 are provided in this order upon viewing from external connection terminals 5.

Next, the ceramic PGA package of this embodiment will be described in detail with reference to FIGS. 2 and 3.

The ceramic PGA package according to this embodiment of the present invention includes the metal plate 2 for enhancing the heat radiation characteristic of a semiconductor pellet 1, a ceramic portion 3 which is formed so as to surround the semiconductor pellet 1, a lid (ceramic cap) 4 for sealing the semiconductor pellet 1 in a cavity, and the external connection terminals (external pins) 5 which are electrically connected to the semiconductor pellet 1.

The metal plate 2 is formed of CuW (copper tungsten) and designed in a convex shape. The projecting portion (convex portion) of the metal plate 2 serves as a pellet mount portion 21 on which the semiconductor pellet 1 is mounted. The semiconductor pellet 1 is joined to the pellet mount portion 21 via a joint material or an adhesive material (resin paste) 6.

The ceramic portion 3 is formed by laminating plural green sheets at plural stages and then sintering the laminated green sheets. Here, the green sheet is a "raw" sheet before it is sintered into ceramic. The ceramic portion 3 includes a conductive wire (pattern) 31 and a conductive wire (via) 32 which are formed before the sintering process. The pattern 31 is formed on each green sheet prior to the laminating process by a screen process printing. The via 32 is used to connect the respective patterns 31 formed on the green sheets to one another in the vertical direction, and it is provided in each viahole formed in the green sheet before the sintering process. Further, the ceramic portion 3 is joined to the metal plate 2 with soldering material (AgCu or the like) 7 to form a cavity C in which the semiconductor pellet 1 is accommodated.

Figure 2:
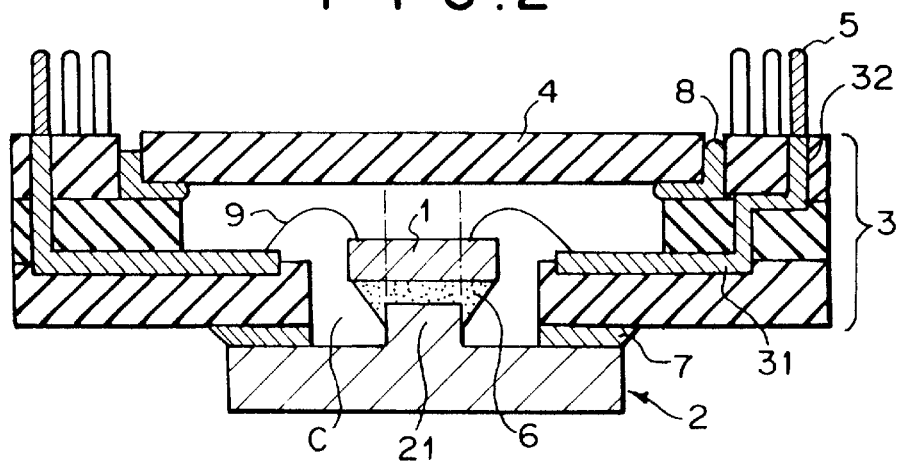
FIG. 2 is a schematic cross-sectional view showing a ceramic PGA package according to a first embodiment of the present invention.

In this embodiment, the cavity C is formed so as to have a space between the inner wall of the ceramic portion 3 and both the semiconductor pellet 1 and the projecting pellet mount portion 21 as shown in FIG. 2 while the semiconductor pellet 1 is accommodated in the cavity C.

The ceramic cap 4 is joined to the ceramic portion 3 with a sealing material 8 to seal the semiconductor pellet 1 in the cavity C. The external connection terminals 5 are external pins which are disposed in an array form on the surface of the ceramic portion 3 at the ceramic cap 4 side. Each external connection terminal 5 is electrically connected to the semiconductor pellet 1 through a thin metal wire (aluminum wire) 9 connected to each terminal on the semiconductor pellet 1, the pattern 31 connected to the aluminum wire 9 and the via 32.

Figure 3:
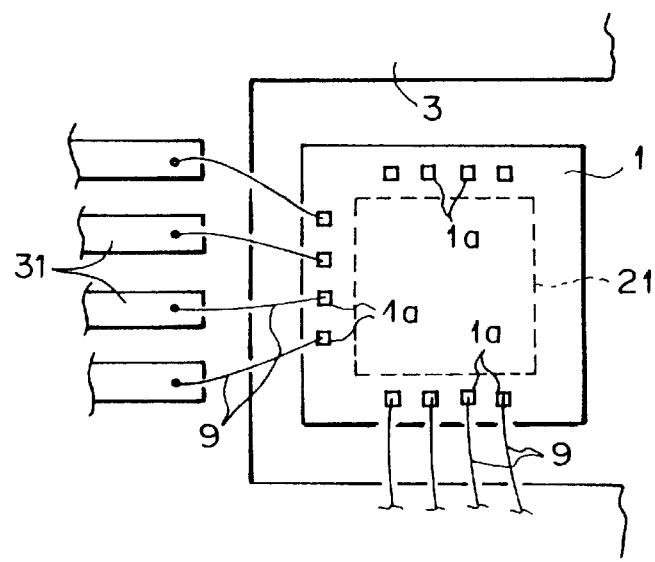
FIG. 3 is a partial plan view of the first embodiment of the present invention.

In this embodiment, as shown in FIG. 3, the aluminum wire (bonding wire) 9 extends from the bonding pad 1a on the semiconductor pellet 1 so that it is connected to the upper surface of the semiconductor pellet 1 at a position outside of the projecting pellet mount portion 21.

Further, in this embodiment, the pellet mount portion 21 is formed so that the area of the surface of the pellet mount portion 21 on which the semiconductor pellet 1 is mounted (i.e., the pellet mount surface of the pellet mount portion 21) is smaller than the area of the surface (lower surface) of the semiconductor pellet 1 which is mounted on the pellet mount portion 21 (i.e., the joint surface of the semiconductor pellet 2) as shown in FIGS. 2 and 3. Further, as shown in FIG. 3, the semiconductor pellet 1 is disposed so as to cover the overall pellet mount surface of the pellet mount portion 21 (indicated by a broken line). That is, the periphery of the joint surface of the semiconductor pellet 1 is located at the outside of the periphery of the pellet mount surface of the pellet mount portion 21. With this design, even if the coating amount of resin paste 6 is large when the semiconductor pellet 1 is joined to the pellet mount portion 21 of the metal plate 2 through the resin paste 6, the extra resin paste 6 goes along the side surface of the pellet mount portion 21 of the metal plate 2 and moves downwardly in FIG. 2.

Further, when the semiconductor pellet 1 is joined to the pellet mount portion 21 of the metal plate 2 with the resin paste 6, the semiconductor pellet 1 is generally scrubbed and joined to the pellet mount portion 21 by using a jig which is called as "collet". In this case, even when the frequency of the scrubbing operation is high, the resin paste 6 goes along the side surface of the pellet mount portion 21 and moves downwardly in FIG. 2 as in the case where the coating amount of the resin paste 6 is large.

That is, as shown in FIG. 2, the joint material 6 joins the semiconductor pellet 1 onto the pellet mount portion 21 so that it does not leak from the joint surface of the semiconductor pellet 1 and it covers the projecting portion of the pellet mount portion 21.

Accordingly, according to the ceramic PGA package of this embodiment, even when the coating amount of the resin paste 6 is large or the scrubbing frequency is high, the resin paste 6 is prevented from climbing up the side portion of the semiconductor pellet 1, whereby the apparent failure and the short-circuit failure can be suppressed and thus the yield can be enhanced.

Further, with this construction, the gap between the semiconductor pellet and the inner lateral wall of the ceramic portion 3 can be reduced, and the length of the bonding wire can be shortened.

(Second Embodiment)

In a ceramic package according to a second embodiment of the present invention, the pellet mount portion 21 is formed as a part of the metal plate 2 to enhance the heat radiation characteristic of the semiconductor pellet 1. Further, the ceramic package of this embodiment is a so-called ceramic ball grid array package having a cavity-down structure (hereinafter referred to as "ceramic BGA package") in which the semiconductor pellet 1 and the pellet mount portion 21 are provided in this order upon viewing from external connection terminals 5'.

Next, the ceramic BGA package of this embodiment will be described in detail with reference to FIG. 4.

The ceramic BGA package of this embodiment includes the metal plate 2 to enhance the heat radiation characteristic of the semiconductor pellet 1, the ceramic portion 3 formed so as to surround the semiconductor pellet 1, the lid (ceramic cap) 4 for sealing the semiconductor pellet 1 in the cavity, and the external connection terminals (balls) 5' which are electrically connected to the semiconductor pellet 1.

The metal plate 2 is formed of CuW (copper tungsten) and designed in a convex shape. The projecting portion of the metal plate 2 serves as a pellet mount portion 21 on which the semiconductor pellet 1 is mounted. The pellet mount portion 21 is joined to the semiconductor pellet 1 with the joint material (resin paste) 6.

The ceramic portion 3 is formed by laminating plural green sheets at plural stages and then sintering the laminated green sheets. The ceramic portion 3 includes a conductive wire (pattern) 31 and a conductive wire (via) 32 which are formed before the sintering process. The pattern 31 is formed on each green sheet prior to the laminating process by a screen process printing. The via 32 is used to connect the respective patterns 31 formed on the green sheets to one another in the vertical direction, and it is provided in each viahole formed in the green sheet before the sintering process. Further, the ceramic portion 3 is joined to the metal plate 2 with soldering material (AgCu or the like) 7 to form a cavity C in which the semiconductor pellet 1 is accommodated.

Figure 4:
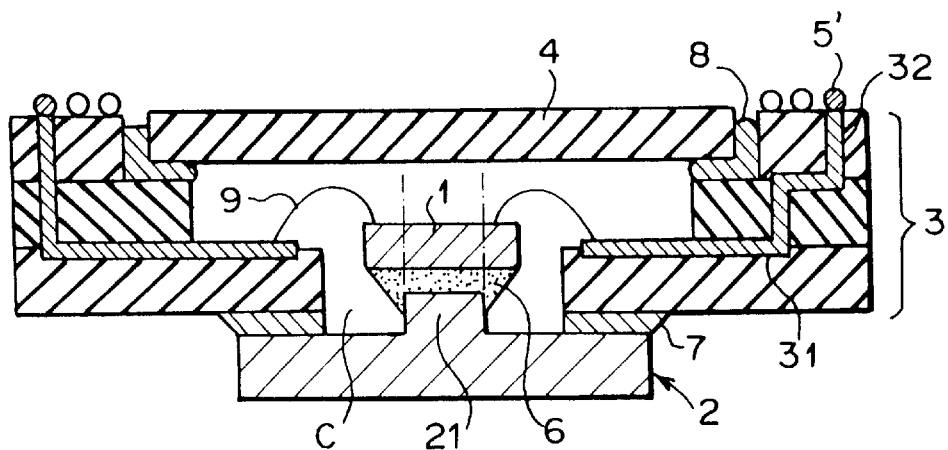
FIG. 4 is a schematic cross-sectional view showing a ceramic BGA package according to a second embodiment of the present invention.

In this embodiment, the cavity C is formed so as to have a space between the inner wall of the ceramic portion 3 and both the semiconductor pellet 1 and the projecting pellet mount portion 21 as shown in FIG. 4 while the semiconductor pellet 1 is accommodated in the cavity C.

The ceramic cap 4 is joined to the ceramic portion 3 with a sealing material 8 to seal the semiconductor pellet 1 in the cavity C. The external connection terminals 5' are balls which are disposed in an array form on the surface of the ceramic portion 3 at the ceramic cap 4 side. Each external connection terminal 5' is electrically connected to the semiconductor pellet 1 through a thin metal wire (aluminum wire) 9 connected to each terminal on the semiconductor pellet 1, the pattern 31 connected to the aluminum wire 9 and the via 32.

In this embodiment, as shown in FIG. 4, the aluminum wire (bonding wire) 9 extends from the bonding pad on the semiconductor pellet 1 so that it is connected to the upper surface of the semiconductor pellet 1 at a position outside of the projecting pellet mount portion 21.

Further, in this embodiment, the pellet mount portion 21 is formed so that the area of the surface of the pellet mount portion 21 on which the semiconductor pellet 1 is mounted (i.e., the pellet mount surface of the pellet mount portion 21) is smaller than the area of the surface (lower surface) of the semiconductor pellet 1 which is mounted on the pellet mount portion 21 (i.e., the joint surface of the semiconductor pellet 2) as shown in FIG. 4. Further, as shown in FIG. 4, the semiconductor pellet 1 is disposed so as to cover the overall pellet mount surface of the pellet mount portion 21. That is, the periphery of the joint surface of the semiconductor pellet 1 is located at the outside of the periphery of the pellet mount surface of the pellet mount portion 21. With this design, even if the coating amount of resin paste 6 is large when the semiconductor pellet 1 is joined to the pellet mount portion 21 of the metal plate 2 through the resin paste 6, the extra resin paste 6 goes along the side surface of the pellet mount portion 21 of the metal plate 2 and moves downwardly in FIG. 4.

Further, when the semiconductor pellet 1 is joined to the pellet mount portion 21 of the metal plate 2 with the resin paste 6, the semiconductor pellet 1 is generally scrubbed and joined to the pellet mount portion 21 by using a jig which is called as "collet". In this case, even when the frequency of the scrubbing operation is high, the resin paste 6 goes along the side surface of the pellet mount portion 21 and moves downwardly in FIG. 4 as in the case where the coating amount of the resin paste 6 is large.

That is, as shown in FIG. 4, the joint material 6 joins the semiconductor pellet 1 onto the pellet mount portion 21 so that it does not leak from the joint surface of the semiconductor pellet 1 and it covers the projecting portion of the pellet mount portion 21.

Accordingly, according to the ceramic BGA package of this embodiment, even when the coating amount of the resin paste 6 is large or the scrubbing frequency is high, the resin paste 6 is prevented from climbing up the side portion of the semiconductor pellet 1, whereby the apparent failure and the short-circuit failure can be suppressed and thus the yield can be enhanced.

Further, with this construction, the gap between the semiconductor pellet and the inner lateral wall of the ceramic portion can be reduced, and the length of the bonding wire can be shortened.

In the ceramic package having the cavity-down structure of the first and second embodiments described above, the heat radiation characteristic can be further enhanced by providing a fin or the like on the metal plate (or on the surface of the pellet mount portion on which the semiconductor pellet is not mounted when no metal plate is provided).

(Third Embodiment)

In a ceramic package according to a third embodiment of the present invention, a pellet mount portion 33 is formed as a part of the ceramic portion 3. Further, the ceramic package of this embodiment is a so-called ceramic pin grid array package having a cavity-up structure (hereinafter referred to as "ceramic PGA package") in which the pellet mount portion 33 and the semiconductor pellet 1 are provided in this order upon viewing from the external connection terminals 5.

Next, the ceramic PGA package of this embodiment will be described in detail with reference to FIG. 5.

The ceramic PGA package according to this embodiment of the present invention includes a ceramic portion 3 having a cavity C in which the semiconductor pellet 1 is accommodated, the lid (ceramic cap) 4 for sealing the semiconductor pellet 1 in the cavity C, and the external connection terminals (external pins) 5 which are electrically connected to the semiconductor pellet 1.

The ceramic portion 3 is formed by laminating plural green sheets at plural stages and then sintering the laminated green sheets. The ceramic portion 3 includes a conductive wire (pattern) and a conductive wire (via) 32 which are formed before the sintering process, and a pellet mount portion 33 which is formed as an island in a convex shape in the cavity to mount the semiconductor pellet 1 thereon through resin paste 6. The pellet mount portion 33 is a ceramic convex portion, and a ceramic portion on which the pellet mount portion 33 is mounted is a ceramic substrate.

Figure 5:
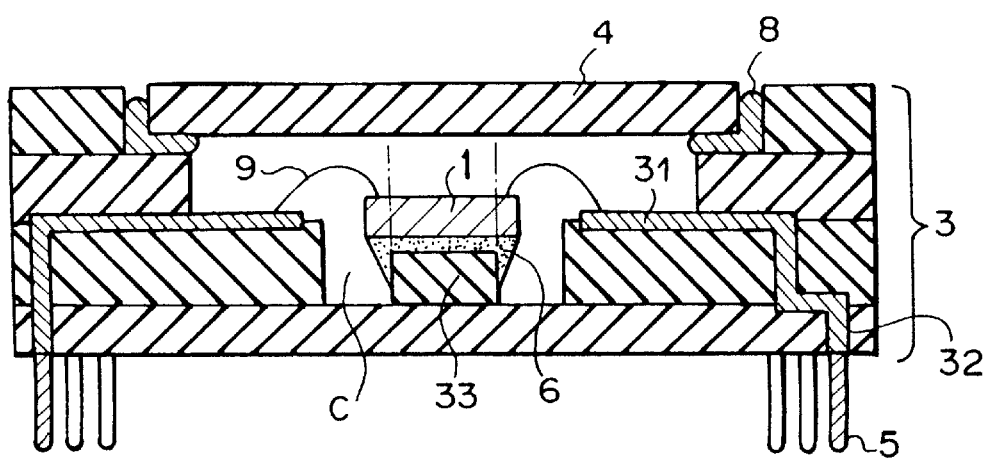
FIG. 5 is a schematic cross-sectional view showing a ceramic PGA package according to a third embodiment of the present invention.

In this embodiment, the cavity C is formed so as to have a space between the inner wall of the ceramic portion 3 and both the semiconductor pellet 1 and the projecting pellet mount portion 33 as shown in FIG. 5 while the semiconductor pellet 1 is accommodated in the cavity C. The pattern 31 is formed on each green sheet prior to the laminating process by a screen process printing. The via 32 is used to connect the respective patterns 31 formed on the green sheets to one another in the vertical direction, and it is provided in each viahole formed in the green sheet before the sintering process.

The ceramic cap 4 is joined to the ceramic portion 3 with a sealing material 8 to seal the semiconductor pellet 1 in the cavity C. The external connection terminals 5 are external pins which are disposed in an array form on the surface of the ceramic portion 3 opposite to the ceramic cap 4 side. Each external connection terminal 5 is electrically connected to the semiconductor pellet 1 through a thin metal wire (aluminum wire) 9 connected to the semiconductor pellet 1, the pattern 31 connected to the aluminum wire 9 and the via 32.

In this embodiment, as shown in FIG. 5, the aluminum wire (bonding wire) 9 extends from the bonding pad on the semiconductor pellet 1 so that it is connected to the upper surface of the semiconductor pellet 1 at a position outside of the projecting pellet mount portion 33.

Further, in this embodiment, the pellet mount portion 33 is formed so that the area of the surface of the pellet mount portion 33 on which the semiconductor pellet 1 is mounted (i.e., the pellet mount surface of the pellet mount portion 33) is smaller than the area of the surface (lower surface) of the semiconductor pellet 1 which is mounted on the pellet mount portion 33 (i.e., the joint surface of the semiconductor pellet 2) as shown in FIG. 5. Further, as shown in FIG. 5, the semiconductor pellet 1 is disposed so as to cover the overall pellet mount surface of the pellet mount portion 33. That is, the periphery of the joint surface of the semiconductor pellet 1 is located at the outside of the periphery of the pellet mount surface of the pellet mount portion 33. With this design, even if the coating amount of resin paste 6 is large when the semiconductor pellet 1 is joined to the pellet mount portion 33 of the ceramic portion 3 through the resin paste 6, the extra resin paste 6 goes along the side surface of the pellet mount portion 33 of the ceramic portion 3 and moves downwardly in FIG. 5.

Further, when the semiconductor pellet 1 is joined to the pellet mount portion 33 of the ceramic portion 3 with the resin paste 6, the semiconductor pellet 1 is generally scrubbed and joined to the pellet mount portion 33 by using a jig which is called as "collet". In this case, even when the frequency of the scrubbing operation is high, the resin paste 6 goes along the side surface of the pellet mount portion 33 and moves downwardly in FIG. 5 as in the case where the coating amount of the resin paste 6 is large.

That is, as shown in FIG. 5, the joint material 6 joins the semiconductor pellet 1 and the pellet mount portion 33 so that it does not leak from the joint surface of the semiconductor pellet 1 and it covers the projecting portion of the pellet mount portion 33.

Accordingly, according to the ceramic PGA package of this embodiment, even when the coating amount of the resin paste 6 is large or the scrubbing frequency is high, the resin paste 6 is prevented from climbing up the side portion of the semiconductor pellet 1, whereby the apparent failure and the short-circuit failure can be suppressed and thus the yield can be enhanced.

Further, with this construction, the gap between the semiconductor pellet 1 and the inner lateral wall of the ceramic portion 3 can be reduced, and the length of the bonding wire can be shortened.

In the above-described first to third embodiments, the area of the pellet mount surface of the pellet mount portion is preferably set as follows. For example, when the semiconductor pellet is designed in a substantially rectangular parallelepiped shape and the pellet mount surface of the pellet mount portion is designed in a substantially rectangular shape, the area of the pellet mount surface of the pellet mount portion is determined so that the length of each side of the pellet mount surface of the pellet mount portion is shorter than the corresponding side of the joint surface of the semiconductor pellet by an amount ranging from 0.1 mm to 4 mm. In this case, no consideration is paid to a semiconductor pellet having a small size of 5 mm or less in square. However, the area of the pellet mount portion is generally determined in consideration of the tolerance in the scrubbing process using the collet and the prevention of cracks from occurring in the semiconductor pellet due to the excessively small size design of the area of the pellet mount portion.

Further, in the above-described first to third embodiments, the three or four layers of green sheets are laminated and then sintered to form the ceramic portion. However, according to the present invention, it is needless to say that the ceramic portion may be formed by laminating five or more green sheets, and the number of green sheet layers is not limited to a specific value. Likewise, the conductive wires comprising the pattern 31 and the via 32 shown in FIGS. 2, 4 and 5 are merely examples of wiring, and thus the present invention is not limited to this style.

Still further, in the above-described first to third embodiments, the specific materials are described as the joint material for joining the respective parts and the materials constituting the respective parts. However, the same effect as described above could be obtained even if the other materials are used, and the present invention is not limited to these specific materials.

When a package is designed, the size of a semiconductor pellet which will be mounted in the packages is known. It is needless to say that the pellet mount portion is designed on the basis of the size of the semiconductor pellet at the time of the design of the package.

Further, in the above-described embodiments, the present invention is applied to the ceramic package. However, the present invention may be applied to other semiconductor mount boards or packages each of which has a pellet mount portion for mounting a semiconductor pellet thereon or therein by using the same mount method.

As described above, according to the present invention, there can be provided a semiconductor device having a semiconductor pellet in the package or on the semiconductor mount board, in which a joint material for joining a semiconductor pellet and a pellet mount portion can be prevented from climbing up toward the upper portion of the semiconductor pellet without increasing the length of bonding wires.

What is claimed is:

1. A semiconductor device comprising a semiconductor pellet having a lower surface which serves as a joint surface having a first side and a second side and is joined to a surface of a pellet mount portion of a metal plate by a joint material said pellet mount portion has a first side and second side, wherein an area of a pellet mount surface of said pellet mount portion is set to be smaller than an area of the joint surface of said semiconductor pellet, the length of the first side and the second side of the pellet mount portion is smaller than the first side and the second side of the joint surface by a distance ranging from 0.1 mm to 4 mm respectively and at least one cavity is between said metal plate and said joint material, the cavity being positioned around the pellet mount portion and lower than the semiconductor pellet.

2. The semiconductor device as claimed in claim 1, wherein a portion of said metal plate is convex.

3. The semiconductor device as claimed in claim 1, wherein the joint surface of said semiconductor pellet is designed in a rectangular shape and the pellet mount surface of said pellet mount portion is designed in a rectangular shape.

4. The semiconductor device as claimed in claim 1, wherein said pellet mount surface of said pellet mount portion is entirely covered by said joint surface of said semiconductor pellet.

5. A semiconductor device comprising:
- a semiconductor pellet having a lower surface which serves as a joint surface having a first side and a second side;
- a pellet mount portion having an upper surface which serves as a pellet mount surface having a first side and a second side, said pellet mount portion being a projecting portion of a metal plate and having a side surface; and
- a joint material joining said joint surface of the semiconductor pellet to said pellet mount portion,
- wherein an area of said pellet mount surface of the pellet mount portion is set to be smaller than an area of said joint surface so that the length of the first side and the second side of the pellet mount surface is smaller than the first side and the second side of the joint surface, respectively,
- said joint material is interposed between said pellet mount surface and a first area of said joint surface positioned as corresponding to the pellet mount surface and between said side surface of the pellet mount portion and a second area of said joint surface positioned around said first area so that said joint material on the side surface tapers off downwards, and
- at least one cavity is positioned between said metal plate and said joint material around the pellet mount portion and under the second area of said joint surface of the semiconductor pellet.

6. A semiconductor device as claimed in claim 5, wherein said joint surface is designed in a rectangular shape and the pellet mount surface is designed in a rectangular shape.

7. A semiconductor device as claimed in claim 5, wherein the length of the first side and the second side of the pellet mount surface is smaller than the first side and the second side of the joint surface by a distance ranging from 0.1 mm to 4 mm, respectively.

8. A semiconductor device as claimed in claim 5, wherein said semiconductor pellet is provided with a bonding pad on an upper surface thereof at an area corresponding to said second area of the joint surface, a bonding wire being connected to said bonding pad.

9. A semiconductor device comprising:
- a semiconductor pellet having a lower surface which serves as a joint surface;
- a pellet mount portion projecting upwardly and having an upper surface and a side surface; and
- a joint material joining said joint surface of the semiconductor pellet to said pellet mount portion,
- wherein an area of said upper surface of the pellet mount portion is set to be smaller than an area of said joint surface, and said joint material is interposed between said upper surface of the pellet mount portion and said joint surface and between said side surface of the pellet mount portion and said joint surface to cover them so that said joint material diminishes downwards.

10. A semiconductor device as claimed in claim 9, wherein said semiconductor pellet is provided with a bonding pad on an upper surface thereof at a peripheral portion outside an area corresponding to said upper surface of the pellet mount portion.

11. A semiconductor device as claimed in claim 9, wherein said bonding pad is positioned as corresponding to an area on said joint surface covered with said joint material.

12. A semiconductor device comprising:
- a semiconductor pellet having a lower surface which serves as a joint surface;
- a pellet mount portion projecting upwardly and having an upper surface and a side surface; and
- a joint material joining said joint surface of the semiconductor pellet to said pellet mount portion,
- wherein an area of said upper surface of the pellet mount portion is set to be smaller than an area of said joint surface, substantially the whole area of said joint surface is covered by said joint material, and a cavity is positioned under said joint material and around said pellet mount portion.

13. A semiconductor device as claimed in claim 12, wherein said semiconductor pellet is provided with a bonding pad on an upper surface thereof at a peripheral portion outside an area corresponding to said upper surface of the pellet mount portion.

14. A semiconductor device as claimed in claim 12, wherein said joint material is interposed between said upper surface of the pellet mount portion and said joint surface and between said side surface of the pellet mount portion and said joint surface to cover them so that said joint material diminishes downwards.

15. A semiconductor device comprising a convex-shaped pellet mount portion, wherein a semiconductor pellet and said pellet mount portion are joined to each other by a joint material so that said joint material does not leak from the a joint surface of semiconductor pellet; said joint materials covers a top projecting portion and at least one side projecting portion of said pellet mount portion.

16. A semiconductor device consisting of:
- a pellet mount portion projecting upwardly from a metal plate and having a upper surface and a side surface; and
- a joint material joining said a joint surface of a semiconductor pellet to said pellet mount portion,
- wherein an area of said upper surface of the pellet mount portion is set to be smaller than an area of said joint surface, the whole area of said joint surface is covered by said joint material, the joint material is the only material joining the pellet mount portion and the semiconductor pellet and the semiconductor pellet is mounted on only the pellet mount portion projecting upwardly.

17. A semiconductor device consisting of:
- a semiconductor pellet having a lower surface which serves as a joint surface;
- a pellet mount portion projecting upwardly and having an upper surface and a side surface; and
- a joint material joining said joint surface of the semiconductor pellet to only said pellet mount portion projecting upwardly, wherein an area of said upper surface of the pellet mount portion is set to be smaller than an area of said joint surface, the whole area of said joint surface is covered by said joint material, said joint material is the only material joining the pellet mount portion and the semiconductor pellet, and said upper surface of the pellet mount portion is joined to said joint surface so that an outer periphery of said upper surface of the pellet mount portion is located inside an outer periphery of said joint surface.

* * * * *